US009905757B2

(12) United States Patent
Choi et al.

(10) Patent No.: US 9,905,757 B2
(45) Date of Patent: Feb. 27, 2018

(54) NONLINEAR MEMRISTOR DEVICES WITH THREE-LAYER SELECTORS

(71) Applicant: Hewlett Packard Enterprise Development LP, Houston, TX (US)

(72) Inventors: Byungjoon Choi, Palo Alto, CA (US); Jianhua Yang, Palo Alto, CA (US); R. Stanley Williams, Palo Alto, CA (US); Gary Gibson, Palo Alto, CA (US); Warren Jackson, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 10 days.

(21) Appl. No.: 15/032,913

(22) PCT Filed: Nov. 12, 2013

(86) PCT No.: PCT/US2013/069528
§ 371 (c)(1),
(2) Date: Apr. 28, 2016

(87) PCT Pub. No.: WO2015/072958
PCT Pub. Date: May 21, 2015

(65) Prior Publication Data
US 2016/0254448 A1 Sep. 1, 2016

(51) Int. Cl.
*H01L 45/00* (2006.01)
*H01L 27/24* (2006.01)

(52) U.S. Cl.
CPC ...... *H01L 45/1226* (2013.01); *H01L 27/2418* (2013.01); *H01L 45/08* (2013.01);
(Continued)

(58) Field of Classification Search
CPC . H01L 45/1226; H01L 45/1253; H01L 45/16; H01L 45/14; H01L 45/1233;
(Continued)

(56) References Cited

U.S. PATENT DOCUMENTS 8,344,348 B2    1/2013  Wicker et al.
2009/0290412 A1  11/2009  Mouli
(Continued)

FOREIGN PATENT DOCUMENTS

JP    2011-103323 A    5/2011
KR    2010-0038317 A   4/2010

OTHER PUBLICATIONS

Huang, J-J. et al., Bipolar Nonlinear Ni/TiO2/Ni Selector for 1S1R Crossbar Array Applications, IEEE Electron Device Letters, Oct. 2011, vol. 32, No. 10, pp. 1427-1429.
(Continued)

*Primary Examiner* — Roy Potter
(74) *Attorney, Agent, or Firm* — Hewlett Packard Enterprise Patent Department (57) ABSTRACT

A nonlinear memristor device with a three-layer selector includes a memristor in electrical series with a three-layer selector. The memristor comprises at least one electrically conducting layer and at least one electrically insulating layer. The three-layer selector comprises a three-layer structure selected from the group consisting of XN—XO—XN; XN—YO—ZN; XN—YO—XN; XO—XN—XO; XO—YN—XO; XO—YN—ZO; XO—YO—XO; XO—YO—ZO; XN—YN—ZN; and XN—YN—XN, X represents a compound-forming metal different from Y and Z.

13 Claims, 5 Drawing Sheets

(52) U.S. Cl.
CPC ...... *H01L 45/1233* (2013.01); *H01L 45/1253* (2013.01); *H01L 45/14* (2013.01); *H01L 45/145* (2013.01); *H01L 45/146* (2013.01); *H01L 45/16* (2013.01)

(58) Field of Classification Search
CPC . H01L 27/2481; H01L 45/145; H01L 45/147; H01L 45/04
See application file for complete search history.

(56) References Cited

U.S. PATENT DOCUMENTS

| | | |
|---|---|---|
| 2011/0266510 A1* | 11/2011 | Quitoriano ............. B82Y 10/00 257/2 |
| 2011/0291063 A1 | 12/2011 | Kai et al. |
| 2012/0091421 A1* | 4/2012 | Wen ................... G11C 13/0007 257/4 |
| 2012/0314477 A1 | 12/2012 | Siau |
| 2013/0003436 A1 | 1/2013 | Kumar |
| 2013/0010520 A1 | 1/2013 | Murooka |
| 2013/0126818 A1 | 5/2013 | Chin et al. |
| 2015/0041751 A1* | 2/2015 | Zhang ..................... H01L 29/47 257/4 |

OTHER PUBLICATIONS

Lee, W. et al., High Current Density and Nonlinearity Combination of Selection Device Based on TaOx/TiO2/TaOx Structure for One Selector—One Resister Arrays. Aug. 28, 2012, 3 Pages.

* cited by examiner

NONLINEAR MEMRISTOR DEVICES WITH THREE-LAYER SELECTORS

BACKGROUND

Memristors are devices that can be programmed to different resistive states by applying a programming energy, for example, a voltage. After programming, the state of the memristor can be read and remains stable over a specified time period. Large crossbar arrays of memristive elements can be used in a variety of applications, including nonvolatile solid state memory, programmable logic, signal processing control systems, pattern recognition, and other applications.

BRIEF DESCRIPTION OF THE DRAWINGS

The following detailed description references the drawings, wherein.

DETAILED DESCRIPTION

Memristors are nano-scale devices that may be used as a component in a wide range of electronic circuits, such as memories, switches, radio frequency circuits, and logic circuits and systems. In a memory structure, a crossbar of memristors may be used. When used as a basis for memories, the memristor may be used to store a bit of information, 1 or 0. When used as a logic circuit, the memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

Memristors may include at least two layers, at least one including an electrically insulating material and at least one including an electrically conducting material. At least one conducting channel in the insulating layer may be formed that are capable of being switched between two states, one in which the conducting channel forms a conducting path ("ON") and one in which the conducting channel does not form a conductive path ("OFF"). High performing memristors, such as ones based on $TaO_x$ or $HfO_x$, generally exhibit linear current-voltage characteristics, in other words, current through the memristor alters linearly with changes in voltage.

Using linear memristors in crossbar arrays may lead to read failure due to sneak currents. Failure may arise when the total read current from an applied read voltage is much higher than the access currant of the memristor due to current sneaking through undesignated neighboring cells. As a result, effort has been spent into developing nonlinear memristor devices. Using a transistor with each memristor has been proposed to overcome the sneak current. However, using a transistor with each memristor in a crossbar array limits array density and increases cost, which may impact the commercialization of memristor devices.

Examples disclosed herein provide for nonlinear memristor devices including a memristor in electrical series with a three-layer selector, in example implementations, the memristor includes an electrically insulating layer and an electrically conducting layer. The three-layer selector may include a number of oxide-based or nitride-based materials. The three-layer selector may possess a crested energy barrier with a height peak in the middle barrier. An electric field may reduce the peak of the crested barrier more significant than the peak of a uniform energy barrier, which typical memristors possess. Therefore, the tunneling current through the crested energy barrier may change more abruptly with an applied electric field, leading to a higher degree of nonlinearity. Thus, when electric currant is passed through the example nonlinear memristor devices, the I-V characteristics of the device may be primarily reflective of the properties of the selector.

In this manner, the devices disclosed herein exhibit high nonlinearity and high endurance. The nonlinearity of these devices suppresses sneak currents, allowing for utilization of example devices in crossbar arrays. The integrated structures of examples also allow high density and tow cost structures. Furthermore, the high endurance allows examples to remain functional after a potentially large number of use cycles. These features may allow the creation of highly integrated memory architectures.

Figure 1:
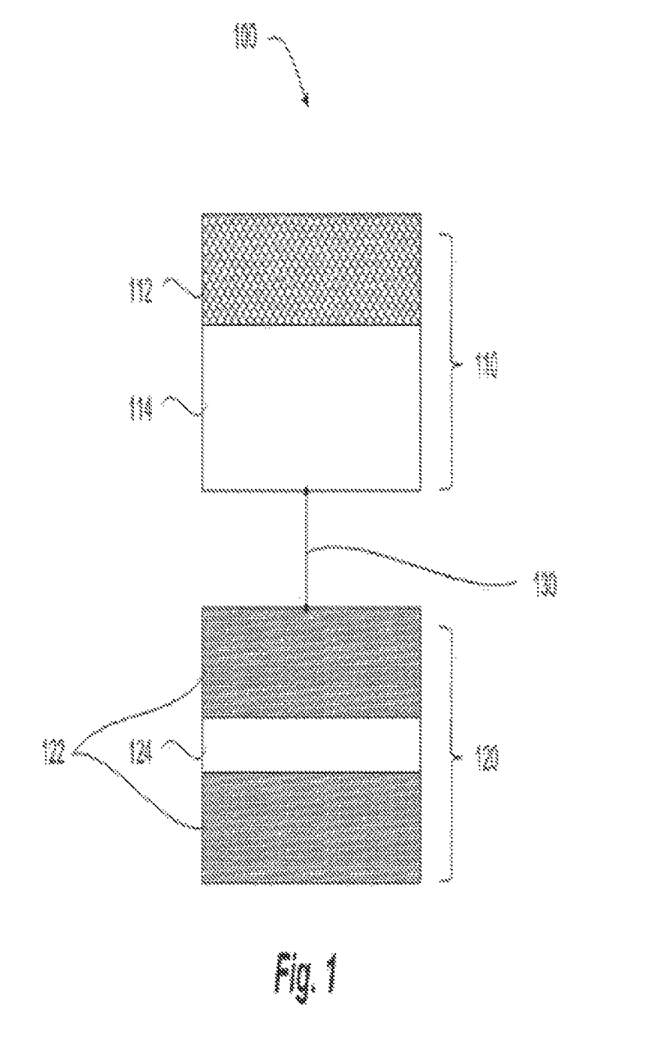
FIG. 1 is a cross-sectional view of an example nonlinear memristor device comprising a three-layer selector in electrical series connection with a memristor.

Referring now to the drawings. FIG. 1 depicts an example nonlinear memristor device 100 including a memristor 110 in electrical series connection 130 with a three-layer selector 120. Memristor 110 may be a resistive electrical component. The resistance of memristor 110 may change with an increase or decrease in voltage across the memristor. Furthermore, memristor 110 may "memorize" its last resistance. In this manner, memristor 110 may be set to at least two states, Nonlinear memristor device 100 may, for example, be a single component in a crossbar array of multiple components. Such an array of a plurality of nonlinear memristor devices 100 may, for example, be utilized in nonvolatile resistive memory, such as random access memory (RRAM).

Memristor 110 may be based on a variety of materials. Memristor 110 may be nitride-based, meaning that at least a portion of the memristor is formed from a nitride-containing composition. Memristor 110 may also be oxide-based, meaning that at least a portion of the memristor is formed from an oxide-containing material. Furthermore, Memristor 110 may be oxy-nitride based, meaning that at least a portion of the memristor is formed from an oxide-containing material and that at least a portion of the memristor is formed from a nitride-containing material. In some examples, memristor 100 may be formed based on tantalum oxide ($TaO_x$) or hafnium oxide ($HfO_x$). Other example materials of memristor 110 may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides such as aluminum nitride, gallium nitride, tantalum nitride, and silicon nitride, in addition, other functioning memristors may be employed in the practice of the teachings herein.

Memristor 110 may include at least two layers in electrical contact at least me electrically conducting layer 112 having an electrically conducting material and at least one electrically insulating layer 114 having an electrically insulating material. Each layer of memristor 110 may be a generally thin film of evenly disposed material. The thickness of the layers may vary with the materials used, desired properties, and intended uses for memristor 110. As used herein, "insulating" and "conducting" are relative terms; for example, electrically conducting layer 112 is more conducting than electrically insulating layer 114, in some examples by at least one order of magnitude. In an example, electrically conducting layer 112 may be tantalum having a thickness of 10 nm, and the electrically insulating layer 114 may be tantalum oxide ($TaO_x$). In various other examples, memristor 110 may include a number of electrically conducting layers 112 and a number of electrically insulating layers 114.

The layers of memristor 110 may be formed by a variety of techniques. These techniques may include ion beam assisted deposition, sputtering, atomic layer deposition, evaporation, and chemical vapor deposition. For example, electrically conducting layer 112 may be toned using high-temperature atomic layer deposition, and electrify insulating layer 114 may be formed using ion beam assisted deposition.

In some examples, the switching function of the nonlinear memristor device 100 may be achieved in memristor 110. In general, electrically insulating layer 114 may be a weak ionic conductor that is semiconducting and/or insulating without dopants. These materials can be doped with native dopants, such as oxide vacancies or impurity dopants (e.g. intentionally introducing different metal ions into electrically insulating layer 114). The resulting doped materials are more electrically conductive than the undoped materials because the dopants inside the layer can be reconfigured by electric fields, leading to the resistance change of the device under electrical fields.

Continuing to refer to FIG. 1, selector 120 may include a three-layer structure and may be based on a variety of materials. Selector 120 may be a component placed in electrical series with memristor 110 that controls the overall electrical properties of the resulting nonlinear memristor device 100. Selector 120 may include two outer layers 122 sandwiching an inner layer 124 in electrical contact. Selector 120 may be nitride-based, meaning that at least a portion of selector 120 is formed from a nitride-containing composition. Selector 120 may also be oxide-based, meaning that al least a portion of selector 120 is formed from an oxide-containing material in some examples, outer layers 122 may be nitride-based, and inner layer 124 may be oxide-based. In other examples, outer layers 122 may be oxide-based, and inner layer 124 may be nitride-based, to further examples, outer layers 122 and inner layer 124 are both oxide-based; alternatively, both outer layers 122 and inner layer 124 are nitride-based.

The three-layer structure of selector 120 may be XN—XO—XN; XN—YO—ZN; XN—YO—XN; XO—XN—XO; XO—YN—XO; XO—YN—ZO; XO—YO—XO; XO—YO—ZO; XN—YN—ZN; and XN—YN—XN. As used herein, X represents a compound-forming metal different from Y and Z. For example, compound forming metals X, Y, and Z may be Ta, Hf, Zr, Al, Co, Ni, Fe, Mb, Mo, W, Cu, Mg, Ca, or Ti. As with the layers of memristor 110 discussed above, each layer of selector 120 may be a generally thin film of evenly disposed material. The thickness of the layers may vary with the materials used and the desired properties. In an example, a layer may have a thickness between 0.5 and 5 nm (nanometers). The layers of selectors 120 may be formed using a variety of techniques, including ion beam assisted deposition, sputtering, atomic layer deposition, evaporation, and chemical vapor deposition. For example, inner layer 124 and outer layers 122 may be formed using atomic layer deposition.

Electrical connection 130 may be a variety of forms of electrical connection. Generally, electrical connection 130 may allow electrical conduction between memristor 110 and selector 120. For example, electrical connection 130 may include an electrode or a wire connection. In another example, electrical connection 130 may simply be the interface formed when memristor 110 is in direct contact with elector 120. In FIG. 1, electrically insulating layer 114 of memristor 110 is shown to be the layer in contact with electrical connection 130. In other examples, electrically conducting layer 112 may be the layer in contact with electrical connection 130. In one example of nonlinear memristor device 100, electrical connection 130 is formed by sandwiching memristor 110 between two electrodes, sandwiching selector 120 between two electrodes, and electrically coupling together one electrode of memristor 110 and one electrode of selector 120. The electrodes may be electrically coupled by the use of a wire or other connection or direct electrical contact.

Examples of nonlinear memristor device 100 as described above exhibit I-V nonlinearity. In other words, when the voltage applied across example device 100 is changed, the current passing through the device 100 changes by a nonlinear factor. In one implementation, nonlinear memristor device 100 exhibits I-V nonlinearity of at least 10. In that implementation, a voltage increase of 1 volt, for example, results in a current increase of a factor of 10. In some examples of nonlinear memristor device 100, nonlinearity of over $10^3$ and even $10^4$ may be achieved.

In some examples, nonlinear memristor device 100 may possess high endurance values. A high endurance value generally means the device retains its properties after repeated use. In one example, nonlinear memristor device 100 may exhibit endurance of at least $10^3$, meaning nonlinear device 100 remains functional after at least 1000 cycles. In some implementations of nonlinear memristor device 100, endurance of over $10^8$ may be achieved.

Figure 2:
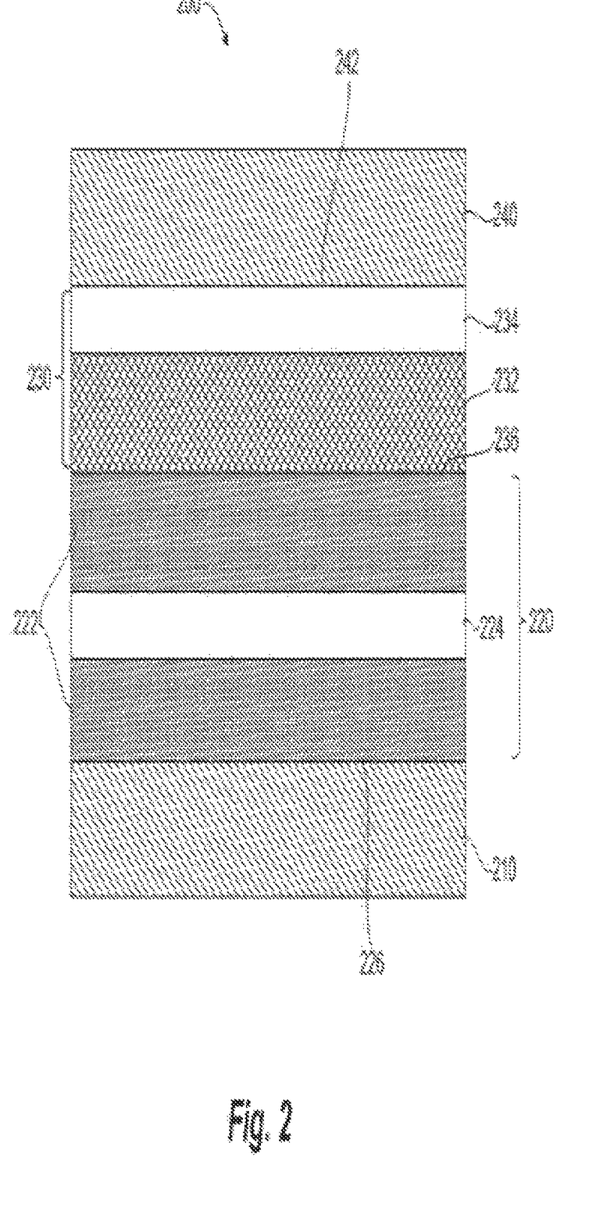
FIG. 2 is a cross-sectional view of an example nonlinear memristor device comprising a three-layer selector in electrical series connection with a memristor, where the materials are stacked in layers.

FIG. 2 depicts an example nonlinear memristor device 200 including a three-layer selector 220 in electrical series connection though second interface 236 with a memristor 230, where the materials are stacked in layers. Nonlinear memristor device 200 may include three-layer selector 220, based on a three-layer structure, coupled with a first electrode 210, forming a first interface 226 between a first outer layer 222 of three-layer selector 220 and first electrode 210. Memristor 230 may be coupled with three-layer selector 220 so that an electrically conducting layer 232 of memristor 230 forms a second interface 236 with a second outer layer 222 of three-layer selector 220. A second electrode 240 may be coupled with memristor 230, forming a third interface 242 between second electrode 240 and an electrically insulating layer 234 of memristor 230. It should be understood that there are many variations of integrated nonlinear memristor device structures, but FIG. 2 depicts a basic structure 200 that will serve the purposes of illustration.

First electrode 210 and second electrode 240 may be an electrically conducting metal, such as Pt, Ta, Hf, Zr, Al, Co, Ni, Fe, Mb, Mo, W, Cu, or Ti, or an electrically conducting metal nitride, such as TiN or TaN. In some implementations, first electrode 210 and second electrode 240 may include the same material. For example, both may be tantalum nitride (TaN) having a thickness of 20 nm. Alternatively, first electrode 210 may have a different material than second electrode 240. For example, first electrode 210 may be TaN while second electrode 240 may be Pt.

Three-layer selector 220 may include a three-layer structure including an inner layer 224 sandwiched between two outer layers 222. Selector 220 may be oxide-based, nitride-based, or oxy-nitride based, and may be one of a number of structures as detailed in connection with three-layer selector 120 of FIG. 1. The thicknesses of inner layer 224 and outer layers 222 may vary with the materials used and the properties desired, and, in some implementations, the thicknesses may have a range between 0.5 to 5 nm. In an example of three-layer selector 220, inner layer 224 may be $TaO_x$ of thickness 2.5 nm, where x may range from 0 to 2.5. Outer layers 222 may be $TaN_{1+x}$ of thickness 3 nm, where x may range from 0 to 1.7. In some examples, the two outer layers 222 may be the same. In other examples, the two outer layers 222 may have different materials and/or different thicknesses. Additional details regarding three-layer selector 220 are provided above in connection with FIG. 1.

Interface 226 may be formed when three-layer selector 220 is coupled with first electrode 210. Interface 228 may be a physical contact between the first outer layer 222 of three-layer selector 220 and first electrode 210 that allows the movement of charge carriers (electrons), enabling the flow of current from electrode 210 to three-layer selector 220, and vice versa. Interface 226 may be an entire face of electrode 210 and an entire face of three-layer selector 220. Alternatively, interface 226 may be an entire face of one of electrode 210 or three-layer selector 220 and a portion of a face of the other.

Memristor 230 may include at least one electrically conducting layer and at least one electrically insulating layer. In some examples, such as the one shown in FIG. 2, memristor 230 includes two layers: an electrically conducting layer 232 and an electrically insulating layer 234. Memristor 230 may be oxide-based or nitride-based and may include a number of materials as detailed in connection with memristor 110 of FIG. 1. The thicknesses of electrically conducting layer 232 and electrically insulating layer 234 may vary with the materials used and the properties desired. In an example of memristor 220, electrically conducting layer 232 may be tantalum of thickness 10 nm. Electrically insulating layer 234 may, for example, be $TaO_x$, where x may range from 0 to 2.5. In examples such as the one depicted in FIG. 2, electrically conducting layer 232 functions as an electrode coupling memristor 230 in electrical series with three-layer selector 220. Additional details regarding memristor 230 are provided above in connection with FIG. 1.

Interface 236 may be formed when memristor 230 is coupled with three-layer selector 220. Interface 236 may be a physical contact between electrically conducting layer 232 of memristor 230 and three-layer selector 220 that allows the flow of current. Interface 236 may be an entire face of three-layer selector 220 and an entire face of electrically conducting layer 232 of memristor 230. Alternatively, interface 236 may be an entire face of one and a portion of a face of the other.

Interface 242 may be formed when second electrode 240 is coupled with memristor 230. Interface 242 may be a physical contact between second electrode 240 and electrically insulating layer 234 of memristor 230 that allows the flow of current. interface 242 may fee an entire face of electrically insulating layer 234 of memristor 230 and an entire face of second electrode 240, Alternatively, interface 242 may be an entire face of one and a portion of the other.

Figure 3:
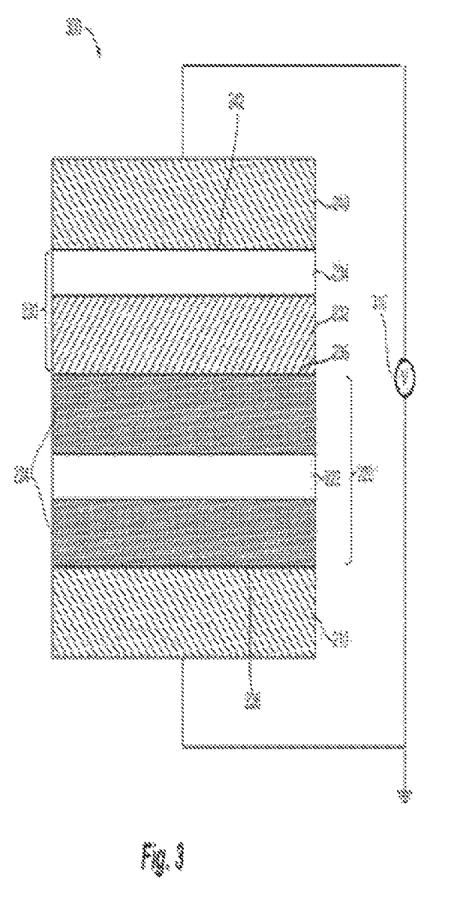
FIG. 3 is an example circuit diagram of a nonlinear memristor device with three-layer selector.

FIG. 3 depicts a circuit 300 including nonlinear memristor device 200 to study memresistivity and nonlinear I-V characteristics in accordance with the teachings herein. In this example, first electrode 210 may be TaN of thickness 20 nm; three-layer selector 220 may include outer layers 222 having 3 nm TaN and inner layer 224 having 2.5 nm $Ta_2O_5$; memristor 230 may include electrically conducting layer 232 having 10 nm Ta and electrically insulating layer 234 having $Ta_2O_5$; and second electrode 240 may be Pt.

A voltage source 310 may be electrically connected to first electrode 210 and second electrode 240. In some examples, switching the circuit ON may be performed by application of a positive voltage, while switching the circuit OFF may be performed by application of a negative voltage. In other examples, the reverse may be true.

Figure 4A:
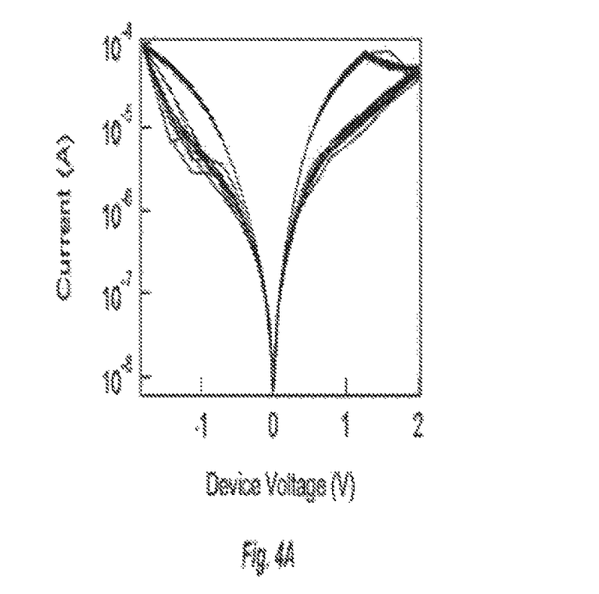
FIG. 4A, on coordinates of current (in A) and voltage (in V), is an example I-V plot of switching agent, where current is deputed on a logarithmic scale.
Figure 4B:
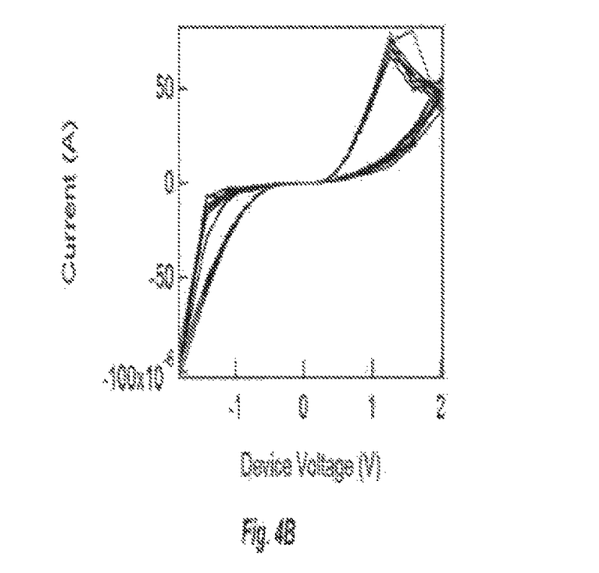
FIG. 4B, on coordinates of current (in A) and voltage (in V), is an example I-V plot of switching current for the device of FIG. 4A, but where current is depicted on a linear scale.

FIGS. 4A and 4B, on coordinates of current (A) and voltage (V), are example I-V plots of switching current showing the switching behavior of circuit 300 in FIG. 3. The switching is performed over a number of consecutive cycles, alternating between positive and negative voltage. FIG. 4A depicts the I-V curve, where current is on a logarithmic scale. FIG. 4B depicts the same data, but with current on a linear scale. Repeatable switching with large $d(I)/d(V)$ (change in current over change in voltage) can be seen from FIGS. 4A and 4B, indicating endurance and nonlinearity, respectively.

Figures 5A, 5B:
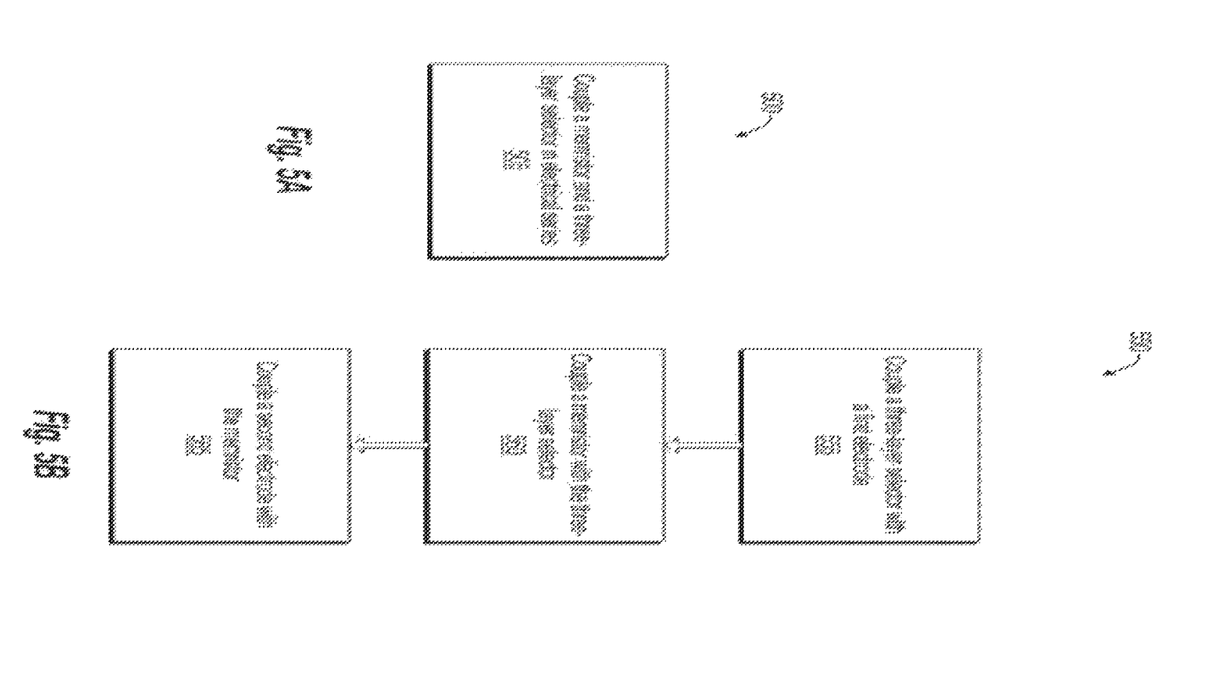
FIGS. 5A and 5B are flowcharts of example methods for manufacturing a nonlinear memristor device.

FIG. 5A is a flowchart of an example method 600 for manufacturing a nonlinear memristor device. Although the execution of method 500 is described below in reference to the manufacture of nonlinear memristor device 100 of FIG. 1, other suitable parties for implementation at method 550 will be apparent.

Method 500 may include block 505, where memristor 110 is coupled in electrical series with three-layer selector 120 to form nonlinear memristor device 100. Memristor 110 may include at least two layers in electrical contact: at least one electrically conducting layer 112 having an electrically conducting material and at least one electrically insulating layer 114 having an electrically insulating material. Selector 120 may be a component placed in electrical series with memristor 110 that controls the overall electrical properties of the resulting nonlinear memristor device 100. Selector 120 may include two outer layers 122 sandwiching an inner layer 124 in electrical contact. Additional details regarding memristor 110 and selector 120 are provided above in connection with FIG. 1.

Block 505 may include a number of ways of coupling memristor 110 in electrical connection 130 with three-layer selector 120, generally allowing electrical conduction between memristor 110 and three-layer selector 120. Electrical connection 130 may be a variety of forms of electrical connection. For example, electrical connection 130 may be an electrode or a wire connection, in another example, electrical connection 130 may simply be the interface formed when memristor 110 is in direct contact with selector 120. Additional details regarding electrical connection 130 are provided above in connection with FIG. 1.

FIG. 5B is a flowchart of an example method 550 for manufacturing a nonlinear memristor device. Although the execution of method 500 is described below in reference to the manufacture of nonlinear memristor device 200 of FIG. 2, other suitable parties for implementation of method 550 will be apparent.

Method 550 may start in block 555, where a three-layer selector 220 is coupled with first electrode 210. The coupling may form an interface between selector 220 and first electrode 210 that facilitates the few of electric current. Method 560 may then proceed to block 560, where memristor 230 is coupled with three-layered selector 220. The coupling may form an interface between memristor 230 and selector 220. Method 550 may then proceed to block 565, where second electrode 240 is coupled with memristor 230. The coupling may form an interface between second electrode 240 and memristor 230. Method 550 may be performed in a different order than described above, for example, method 550 may be executed in sequence of blocks 565-560-555. Other examples include sequences of 565-555-560, 560-565-555, 560-555-565, and 555-565-560.

As described in detail above, nonlinear memristor devices depicted in FIGS. 1 and 2 may include a number of layers. These various layers may be formed by a number of techniques, including ion beam assisted deposition, sputtering, atomic layer deposition, evaporation, and chemical vapor deposition. For example, inner layer 224 of three-layer selector 220 in FIG. 2 may be formed by atomic layer deposition of a 2.5 nm layer of $Ta_2O_5$. In another example, first electrode 210 and second electrode 240 in FIG. 2 may be formed by evaporation of thin layers of TaN or Pt. Further details of the forming techniques are provided above in reference to memristor 110 and selector 120 in FIG. 1.

The foregoing describes a number of examples for nonlinear memristor devices with three-layer selectors, it should be understood that the nonlinear memristor devices described herein may include additional components and that some of the components described herein may be removed and/or modified without departing from the scope of the nonlinear memristor device. It should also be understood that the components depicted in the figures are not drawn to scale and thus, the components may have different relative sizes with respect to each other than as shown in the figures.

What is claimed is:

1. A nonlinear memristor device comprising a memristor in electrical series with a three-layer selector,
   wherein the memristor comprises at least one electrically conducting layer and at least one electrically insulating layer;
   wherein materials of the memristor are stacked in layers, the layers comprising:
   the three-layer selector coupled with a first electrode, forming a first interface between a first outer layer of the three-layer selector and the first electrode;
   the memristor, comprising two layers, coupled with the three-layer selector, wherein the electrically conducting layer of the memristor forms a second interface with a second outer layer of the three-layer selector; and
   a second electrode coupled with the memristor, forming a third interface between the second electrode and the electrically insulating layer of the memristor; and
   wherein the three-layer selector comprises a three-layer structure selected from the group consisting of XN—XO—XN; XN—YO—ZN; XN—YO—XN; XO—XN—XO; XO—YN—XO; XO—YN—ZO; XO—YO—XO; XO—YO—ZO; XN—YN—ZN; and XN—YN—XN,
   wherein X represents a compound-forming metal different from Y and Z.

2. The device of claim 1, wherein the compound-forming metals are selected from the group consisting of Ta, Hf, Zr, Al, Co, Ni, Fe, Nb, Mo, W, Cu, Mg, Ca and Ti.

3. The device of claim 1, wherein the first and second electrodes are selected from the group consisting of Pt Ta, Hf, Zr, Al, Co, Ni, Fe, Nb, Mo, W, Cu, Ti, TaN and TiN.

4. The device of claim 1, wherein the electrically conducting layer of the memristor also serves as a middle electrode interfacing the memristor with the selector, providing a series connection.

5. The device of claim 1, wherein the thicknesses of the layers of the three-layer selector vary with the material used and the thicknesses comprise a range between 0.5 to 5 nanometers for a layer.

6. The device of claim 1, wherein:
   the first electrode comprises a layer of TaN;
   the three-layer selector comprises an inner layer of $TaO_x$ disposed between two outer layers of $TaN_{1+y}$, wherein x represents a value between 0 and 2.5 and y represents a value between 0 and 1.7;
   the memristor comprises an electrically conducting layer of Ta and an electrically insulating layer of $TaO_x$ wherein x represents a value between 0 and 2.5; and
   the second electrode comprises TaN.

7. The device of claim 1, wherein:
   the memristor is disposed between a first electrode and a second electrode;
   the selector is disposed between a third electrode and a fourth electrode; and
   one electrode disposed to the memristor is coupled in electrical series with one electrode disposed to the selector.

8. The device of claim 1, wherein the device exhibits nonlinearity of at least 10.

9. The device of claim 1, wherein the device exhibits endurance of at least $10^3$.

10. A nonlinear memristor device, comprising:
    a three-layer selector coupled with a first electrode,
    wherein the three-layer selector is based on a three-layer structure selected from the group consisting of XN—XO—XN; XN—YO—ZN; XN—YO—XN; XO—XN—XO; XO—YN—XO; XO—YN—ZO; XO—YO—XO; XO—YO—ZO; XN—YN—ZN; and XN—YN—XN,
    wherein X represents a compound-forming metal different from Y and Z, and
    wherein a first outer layer of the three-layer selector forms a first interface with the first electrode;
    a memristor, wherein materials of the memristor are stacked in layers, the layers comprising an electrically conducting layer and an electrically insulating layer, coupled with the three-layer selector, wherein the electrically conducting layer of the memristor forms a second interface with a second outer layer of the three-layer selector; and
    a second electrode coupled with the memristor, wherein the second electrode forms a third interface with the electrically insulating layer of the memristor.

11. A method of manufacturing a nonlinear memristor device comprising:
    coupling in electrical series;
    a memristor comprising at least one electrically conducting layer and at least one electrically insulating layer;
    a three-layer selector comprising a three-layer structure selected from the group consisting of XN—XO—XN; XN—YO—ZN; XN—YO—XN; XO—XN—XO; XO—YN—XO; XO—YN—ZO; XO—YO—XO; XO—YO—ZO; XN—YN—ZN; and XN—YN—XN,
    wherein X represents a compound-forming metal different from Y and Z; and coupling the three-layer selector with a first electrode, forming a first interface between a first outer layer of the three-layer selector and the first electrode;

coupling the memristor, comprising two layers, with the three-layer selector, wherein the electrically conducting layer of the memristor forms a second interface with a second outer layer of the three-layer selector; and coupling a second electrode with the memristor, forming a third interface between the second electrode and the electrically insulating layer of the memristor.

12. The method of claim 11, wherein the compound-forming metals are selected from the group consisting of Ta, Hf, Zr, Al, Co, Ni, Fe, Nb, Mo, W, Cu, Mg, Ca and Ti.

13. The method of claim 11, wherein:

the first electrode comprises a layer of TaN;

the three-layer selector comprises an inner layer of $TaO_x$ disposed between two outer layers of $TaN_{1+y}$, wherein x represents a value between 0 and 2.5 and y represents a value between 0 and 1.7;

the memristor comprises an electrically conducting layer of Ta and an electrically insulating layer of $TaO_x$ wherein x represents a value between 0 and 2.5; and the second electrode comprises TaN.

* * * * *